United States Patent
Kawai et al.

[11] Patent Number: 6,097,433
[45] Date of Patent: Aug. 1, 2000

[54] SOLID STATE IMAGING APPARATUS HAVING A PLURALITY OF METAL WIRINGS FOR SUPPLYING DRIVING PULSES TO TRANSFER ELECTRODES OF VERTICAL CCD REGISTERS

[75] Inventors: Shinichi Kawai; Michihiro Morimoto; Masayuki Furumiya; Chihiro Ogawa; Keisuke Hatano; Yasuaki Hokari; Takashi Sato; Nobuhiko Mutoh; Ichiro Murakami; Shinobu Suwazono; Hiroaki Utsumi; Kouichi Arai; Kozo Orihara; Nobukazu Teranishi; Takao Tamura, all of Tokyo, Japan

[73] Assignee: NEC Corporation, Japan

[21] Appl. No.: 08/869,442

[22] Filed: Jun. 5, 1997

[30] Foreign Application Priority Data

Jun. 10, 1996 [JP] Japan ................................. 8-147246

[51] Int. Cl.$^7$ .............................. H04N 3/14; H04N 5/335
[52] U.S. Cl. ......................... 348/315; 348/317; 348/322; 257/229; 257/232
[58] Field of Search ...................... 250/208.1; 257/229, 257/231, 232, 245; 348/294, 311, 312, 315, 316, 317, 319–324; H04N 5/335, 3/14

[56] References Cited

U.S. PATENT DOCUMENTS 5,194,751  3/1993  Yonemoto .............................. 348/317
5,442,396  8/1995  Nakashiba .............................. 348/322
5,537,146  7/1996  Tohyama ................................ 348/311
5,796,433  8/1998  Dyck ...................................... 348/311

FOREIGN PATENT DOCUMENTS 3126261   5/1991   Japan ........................... H01L 27/148
3256359   11/1991  Japan ........................... H01L 27/148
4109673   4/1992   Japan ........................... H01L 27/148
4216672   8/1992   Japan ........................... H01L 27/148
6169079   6/1994   Japan ........................... H01L 27/148

OTHER PUBLICATIONS

"Optical Limitations to Cell Size Reduction in IT–CCD Image Sensors" Satoh et al.
IEEE International Electron Devices Meeting Technical Digest; Dec. 1995; pp. 159–162.

*Primary Examiner*—Wendy Garber
*Assistant Examiner*—Ngoc-Yen Vu
*Attorney, Agent, or Firm*—Hayes, Soloway, Hennessey, Grossman & Hage, P.C.

[57] ABSTRACT

Shunt wirings (12) in the form of a conductive light intercepting film which covers over vertical CCD registers and also serves to supply power, project into locations between adjacent photoelectric transducers (11) in the vertical direction, and the distance between the projecting portions of adjacent ones of the metal wirings is set to 0.2 $\mu$m or less and is limited to a distance with which an electric field between adjacent ones of the metal wirings is $10^7$ V/cm or less and the adjacent metal wirings do not suffer from short-circuiting.

2 Claims, 11 Drawing Sheets

SOLID STATE IMAGING APPARATUS HAVING A PLURALITY OF METAL WIRINGS FOR SUPPLYING DRIVING PULSES TO TRANSFER ELECTRODES OF VERTICAL CCD REGISTERS

BACKGROUND OF THE INVENTION

1. Field of the Invention

This invention relates to a solid state imaging apparatus of the interline transfer type or the frame interline transfer type, and more particularly to a solid state imaging apparatus wherein metal wirings for supplying driving pulses to transfer electrodes of vertical CCD registers are provided along the vertical CCD registers and the smear characteristic is improved.

2. Description of the Related Art

Figure 1:
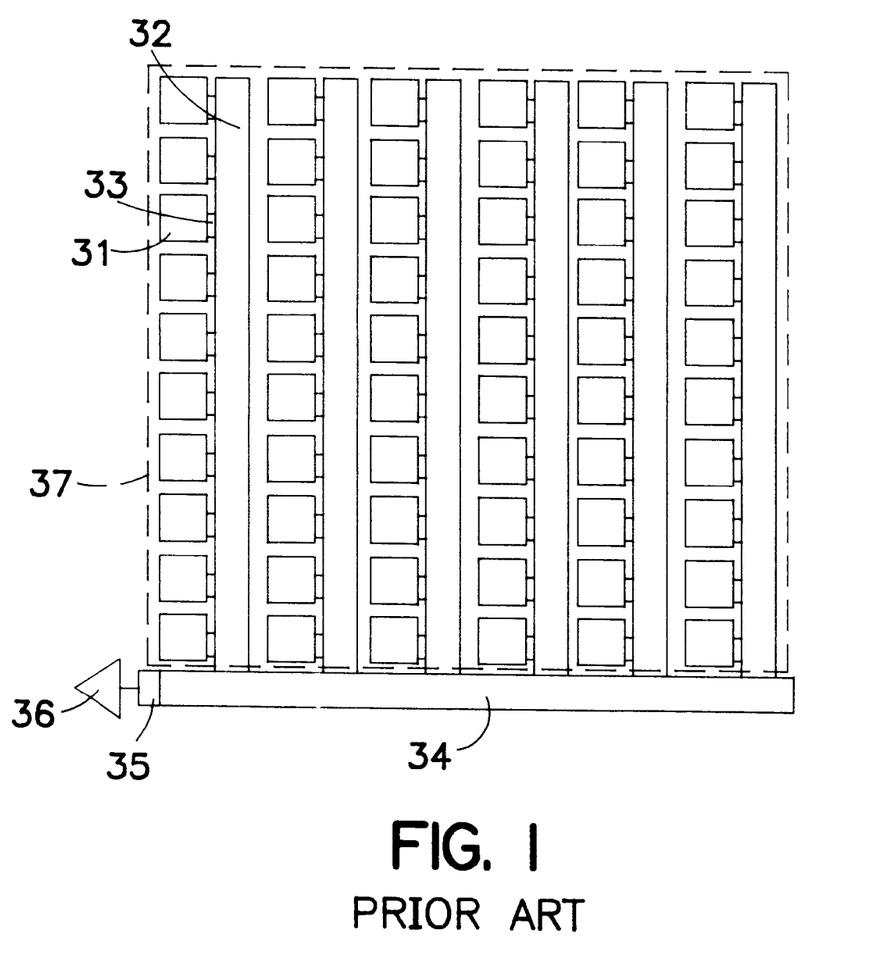
FIG. 1 is a schematic view of a conventional solid state imaging apparatus of the interline transfer type.

An interline transfer type solid state imaging apparatus of the type mentioned which has conventionally been employed usually adopts such a construction as shown in FIG. 1.

FIG. 1 is a schematic view of a conventional solid state imaging apparatus of the interline transfer type. Referring to FIG. 1, reference numeral 31 denotes a photoelectric transducer, 32 a vertical CCD register, 33 a charge read-out region, 34 a horizontal CCD register, 35 a charge detector, 36 an output amplifier, and 37 an imaging region.

A plurality of photoelectric transducers 31 are arranged two-dimensionally, and vertical CCD registers 32 are provided corresponding to columns of the photoelectric transducers. Charge read-out regions 33 are formed between photoelectric transducers 31 and vertical CCD registers 32. Horizontal CCD register 34 is provided at ends of vertical CCD registers 32, and charge detector 35 and output amplifier 36 are formed at an end of horizontal CCD register 34. It is to be noted that an area surrounded by broken lines is imaging region 37.

Signal charge photo-electrically converted by photoelectric transducers 31 is transferred to vertical CCD registers 32 via charge read-out regions 33. The read out signal charge is transferred to horizontal CCD register 34 by vertical CCD registers 32 and further to charge detector 35 by horizontal CCD register 34 and then outputted via output amplifier 36.

Figure 2:
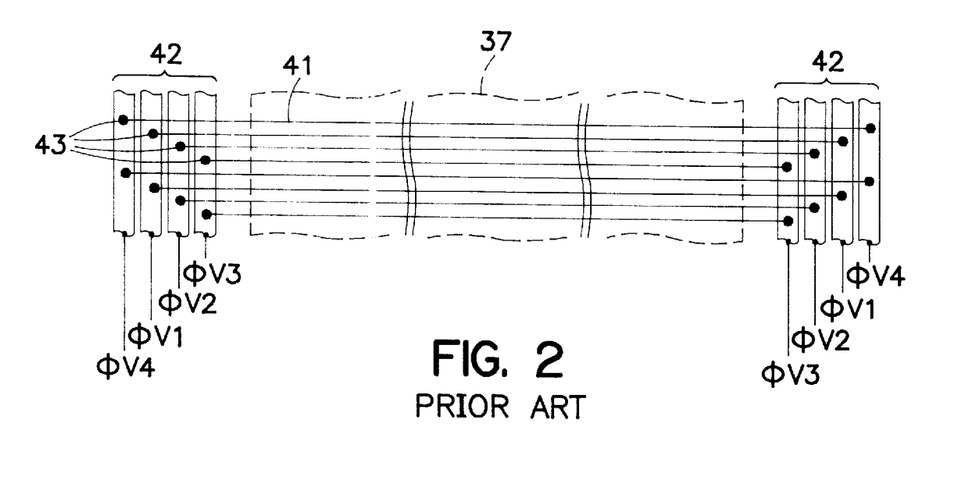
FIG. 2 is a schematic view showing a form of connection between vertical transfer electrodes arranged for vertical CCD registers and vertical bus lines for supplying vertical driving pulses to the vertical transfer electrodes in a conventional imaging apparatus.

FIG. 2 is a schematic view showing a form of connection between vertical transfer electrodes arranged on vertical CCD registers in a conventional solid state imaging apparatus and vertical bus lines for supplying vertical driving pulses to the vertical transfer electrode. In FIG. 2, reference numeral 37 denotes an imaging region, 41 a vertical transfer electrode, 42 a vertical bus line, and 43 a contact.

Here, a case wherein four phase vertical driving pulses ($\Phi$V1 to $\Phi$V4) are used for driving is shown. Vertical transfer electrodes 41 extend in a horizontal direction in imaging region 37 and are connected to vertical bus lines 42 at both ends of imaging region 37 by contacts 43 periodically at intervals of four electrodes in the vertical direction. Generally, since vertical transfer electrodes 41 are formed from a polycrystalline silicon film or a like film, at a central location of imaging region 37 remote from vertical bus lines 42, reduction in transfer charge amount and degradation in transfer efficiency are sometimes caused by rounding in waveform of vertical driving pulses by the resistances and capacitances of vertical transfer electrodes 41.

A technique is known wherein, in order to overcome this problem, vertical transfer electrodes 41 are backed with metal wirings (hereinafter referred to as shunt wirings) formed from a tungsten film, an aluminum film or some other suitable film. A solid state imaging apparatus which uses this technique is disclosed, for example, in Japanese Patent Laid-Open Application No. Heisei 3-256359.

Figure 3:
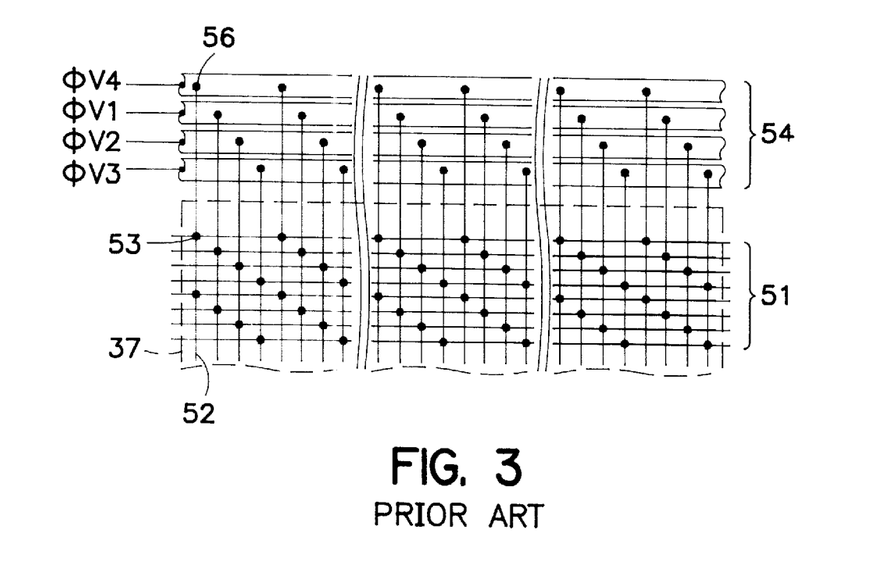
FIG. 3 is a schematic view showing a form of connection among vertical transfer electrodes, shunt wirings and vertical bus lines in another conventional solid state imaging apparatus which includes a shunt wiring.

FIG. 3 is a schematic view illustrating a form of connection among vertical transfer electrodes, shunt wirings and vertical bus lines in a conventional solid state imaging apparatus which has shunt wirings. In FIG. 3, reference numeral 37 denotes an imaging region, 51 a vertical transfer electrode, 52 a shunt wring, 53 a backing contact, 54 a vertical bus line, and 56 a contact.

Here, a case wherein four phase vertical driving pulses ($\Phi$V1 to $\Phi$V4) are used is shown. Vertical transfer electrodes 51 extend in a horizontal direction in imaging region 37 and are connected by backing contacts 53 to shunt wirings 52 provided on vertical CCD registers 32. Backing contacts 53 are provided periodically at intervals of four electrodes in the vertical direction and at intervals of 4 pixels in the horizontal direction. Shunt wirings 52 extend outwardly from imaging region 37 and are connected to vertical bus lines 54 extending in the horizontal direction by contacts 56 periodically at intervals of four pixels in the horizontal direction. Vertical driving pulses $\Phi$V1 to $\Phi$V4 are individually applied to vertical bus lines 54.

Next, the construction of shunt wirings 52 is described in more detail.

Figure 4:
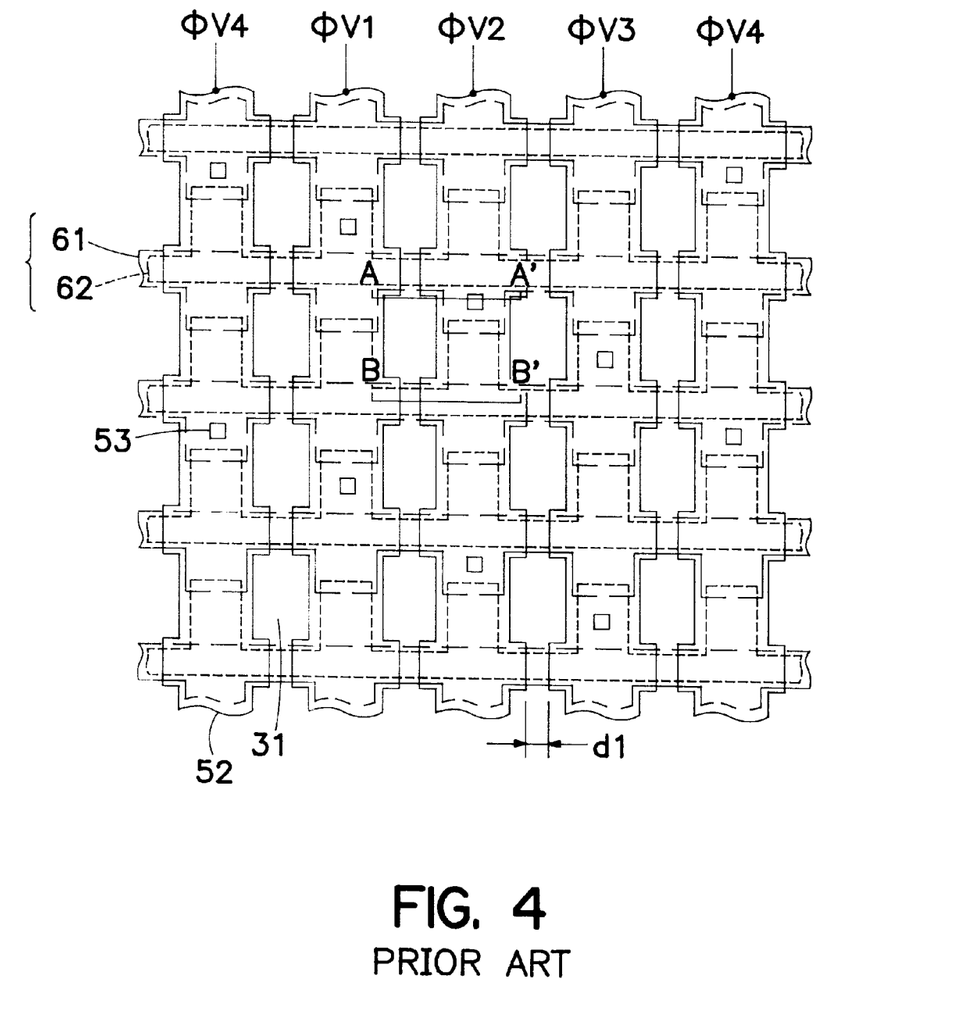
FIG. 4 is a schematic plan view showing, in an enlarge scale, part of an imaging region shown in FIG. 3.

FIG. 4 is a schematic plan view showing, in an enlarged scale, part of the imaging region shown in FIG. 3. In FIG. 4, reference numeral 31 denotes a photoelectric transducer, 52 a shunt wiring, 53 a backing contact, and 61 and 62 denote each a vertical transfer electrode.

Here, the imaging region is shown for approximately four pixels in the vertical and horizontal directions. A plurality of vertical transfer electrodes 61 and 62 are provided for vertical CCD registers 32. Vertical transfer electrodes 61 and 62 extend in the horizontal direction and are formed in a comb-like shape such that they may form openings above photoelectric transducers 31. Shunt wirings 52 extend in the vertical direction on vertical CCD registers 32 such that they cover over vertical transfer electrodes 61 and 62. Shunt wirings 52 are connected to vertical transfer electrodes 61 and 62 periodically at intervals of four electrodes in the vertical direction and at intervals of four pixels in the horizontal direction by backing contacts 53. It is to be noted that, since shunt wirings 52 function as wirings for supplying vertical driving pulses to vertical transfer electrodes 61 and 62, each two shunt wirings adjacent to each other are separated from each other in regions (hereinafter referred to as delivery regions) between photoelectric transducers 31 adjacent to each other in the vertical direction. It is to be noted that the gap between adjacent shunt wirings 52 is denoted by d1.

Figure 5:
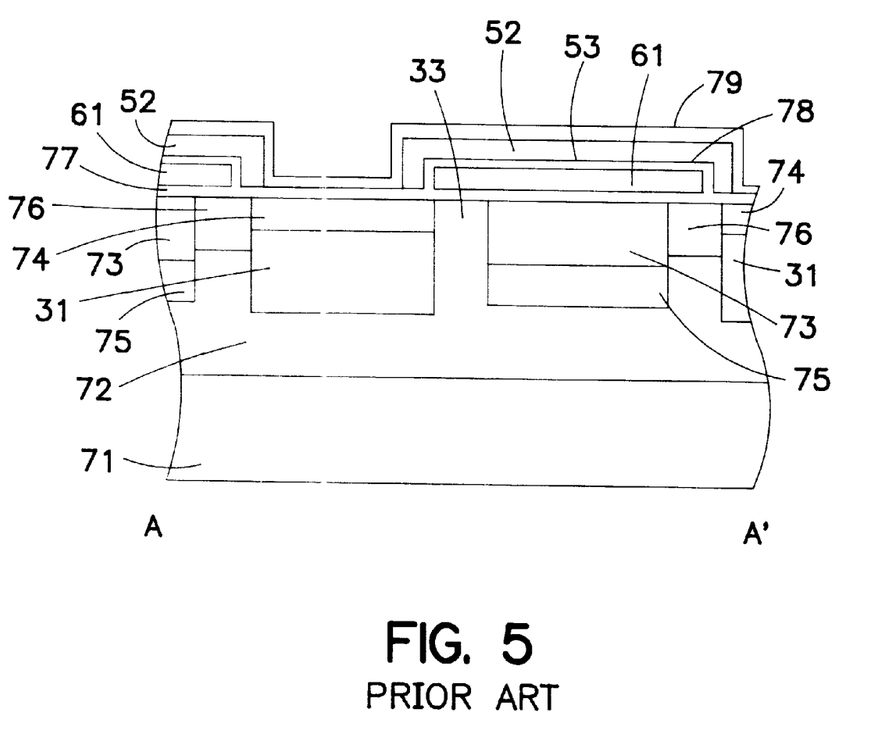
FIG. 5 is a schematic sectional view taken along line A–A' of FIG. 4 including a photoelectric transducer.

Next, a sectional construction of a pixel is described with reference to two figures. FIG. 5 is a schematic sectional view taken along A–A' of FIG. 4 including a photoelectric transducer. In FIG. 5, reference numeral 31 denotes a photoelectric transducer, 33 a charge read-out region, 52 a shunt wiring, 53 a backing contact, 61 a vertical transfer electrode, 71 a semiconductor substrate, 72 a low density well, 73 a charge transfer element, 74 a high density diffused layer, 75 a barrier region, 76 a channel stop, and 77, 78 and 79 each denotes an insulation film.

Referring to FIG. 5, low density well 72 is provided on a main surface of semiconductor substrate 71. Photoelectric transducers 31 and charge transfer elements 73 are provided in low density well 72. High density diffused layer 74 for reducing dark current is provided in contact with the front face sides of photoelectric transducers 31. Further, barrier regions 75 for preventing invasion of charge to the charge transfer elements by diffusion are provided in contact with the opposite sides to the front faces of charge transfer elements 73. Charge read-out regions 33 for transferring signal charge from photoelectric transducers 31 to charge transfer elements 73 are provided between photoelectric transducers 31 and charge transfer elements 73 corresponding to photoelectric transducers 31. Further, channel stops 76 are provided between photoelectric transducers 31 remote from charge read-out regions 33 and charge transfer elements 73. Vertical transfer electrodes 61 are provided on the surface of semiconductor substrate 71 with insulation film 77 interposed therebetween, and further, shunt wirings 52 are provided with insulation film 78 interposed therebetween. Shunt wirings 52 are connected to vertical transfer electrodes 61 by backing contacts 53. Insulation film 79 is provided above shunt wirings 52.

Figure 6:
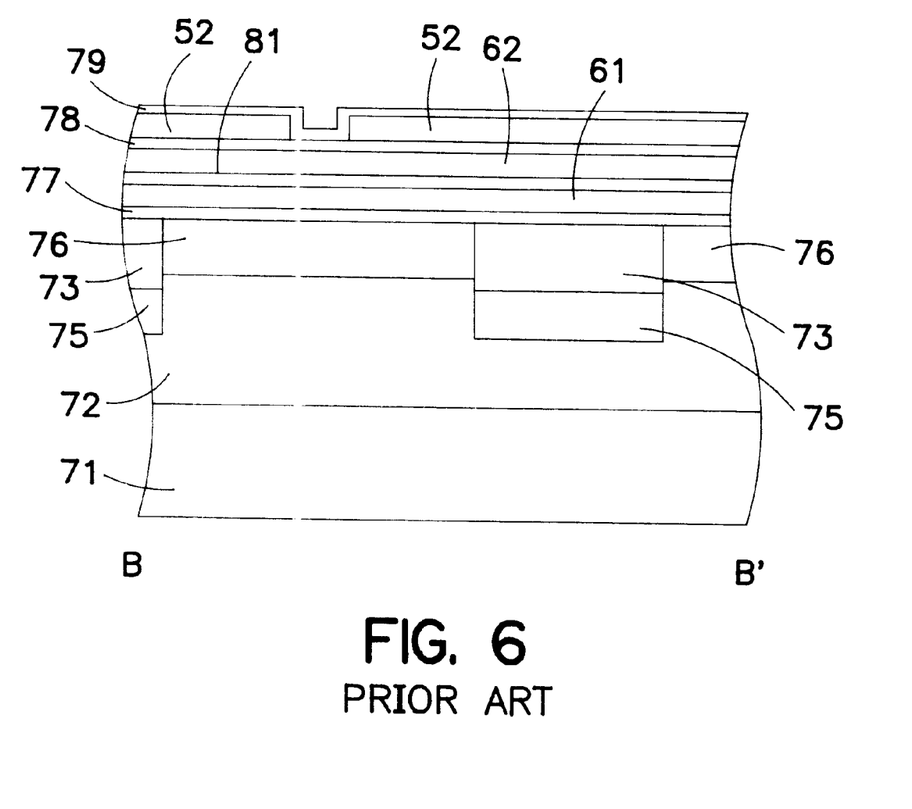
FIG. 6 is a schematic sectional view taken along line B–B' of FIG. 4 including a delivery region.

FIG. 6 is a schematic sectional view taken along line B–B' of FIG. 4 including a delivery region. In FIG. 6, reference numeral 62 denotes a vertical transfer electrode, and 81 an insulation film, and the same components as those in FIG. 5 are denoted by the same reference numerals.

As shown in FIG. 6, in the section including a delivery region, channel stops 76 are provided on both sides of each charge transfer element 73. Vertical transfer electrode 61 is provided on the surface of semiconductor substrate 71 with insulation film 77 interposed therebetween, and vertical transfer electrode 62 is provided on vertical transfer electrode 61 with insulation film 81 interposed therebetween. Further, shunt wiring 52 is provided on vertical transfer electrode 62 with insulation film 78 interposed therebetween, and insulation film 79 is provided on shunt wiring 52.

Next, an example of method of production of the conventional imaging apparatus having the section shown in FIG. 6 is described with reference to the drawings. It is to be noted that, in order to make differences from the present invention clear, description is given with stress placed on the step of forming shunt wirings 52.

FIGS. 7(a) to 7(c) and 8(d) to 8(f) are schematic sectional views illustrating a flow of steps of production of the conventional imaging apparatus. In those figures, reference 91 denotes a resist, and the same components as those in FIG. 6 are denoted by the same reference numerals.

Figure 7A:
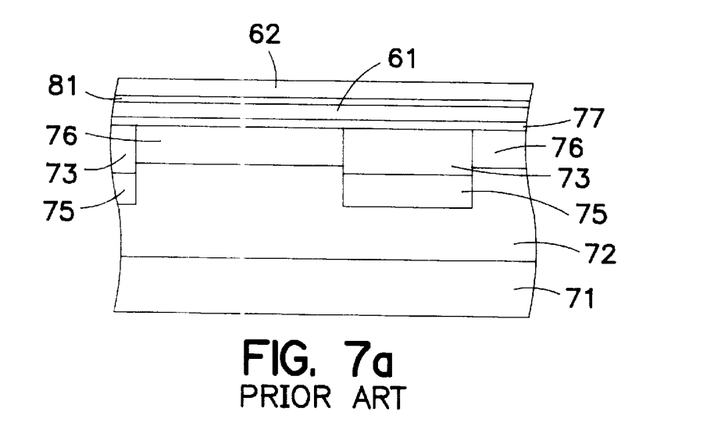
FIGS. 7(a) to 7(c) are schematic sectional views illustrating a flow of a process of producing a conventional imaging apparatus.

As shown in FIG. 7(a), ions are implanted into semiconductor substrate 71 using, as a mask, a resist pattern formed using a photo-lithography technique to form photoelectric transducers 31 (not shown), high density diffused layer 74 (not shown), barrier regions 75, charge transfer elements 73, charge read-out regions 33 (not shown) and channel stops 76.

Then, insulation film 77 made of a silicon dioxide film, a silicon nitride film or some other suitable film is formed on a main surface of semiconductor substrate 71, and then a polycrystalline silicon film of the first layer is formed and selective etching of it is performed using, as a mask, a resist pattern formed using a photo-lithography technique to form vertical transfer electrodes 61 of the first layer. Further, insulation film 81 made of a silicon dioxide film, a silicon nitride film or some other suitable film is formed, and then vertical transfer electrodes 62 made of a polycrystalline silicon film of the second layer are formed in a similarly manner as in the formation of vertical transfer electrodes 61.

Figure 7B:
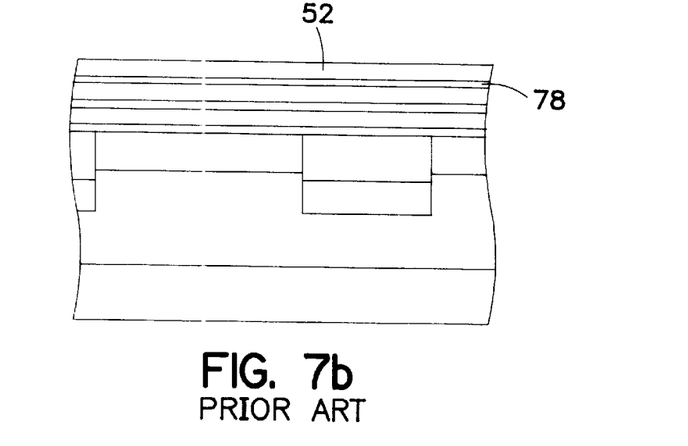

Then, insulation film 78 made of a silicon dioxide film or some other suitable film is formed as seen in FIG. 7(b), and selective etching is performed using, as a mask, a resist pattern formed using a photo-lithography technique to form backing contacts 53 (not shown). Thereafter, shunt wirings 52 made of a tungsten film, an aluminum film or some other suitable film is formed by a sputtering method or a chemical gas phase growth method.

Figure 7C:
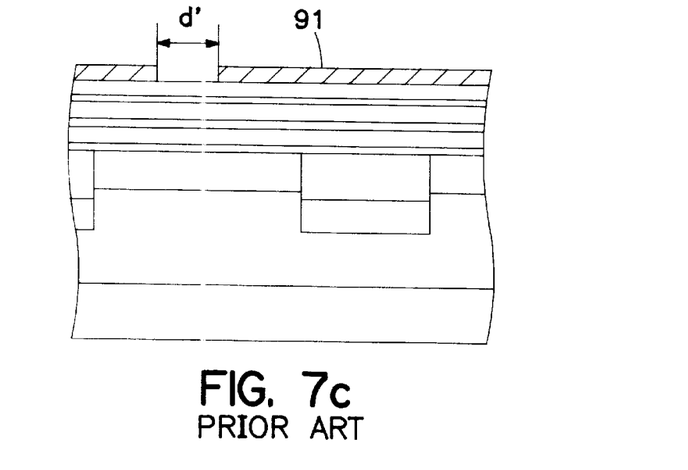

Then, resist 91 is applied to shunt wirings 52 as shown in FIG. 7(c), and the resist at portions of the delivery regions and at the openings (not shown) of photoelectric transducers 31 is removed using a photo-lithography technique. Here, the resist opening width on the delivery regions is denoted by d'.

Figure 8D:
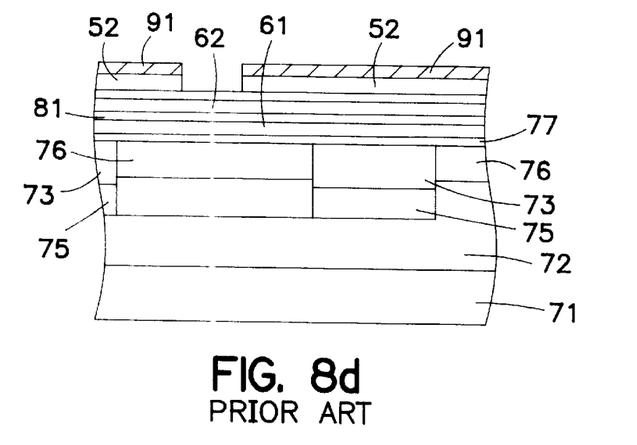
FIGS. 8(d) to 8(f) are schematic sectional views illustrating a succeeding flow of the process of producing the conventional imaging apparatus.
Figure 8E:
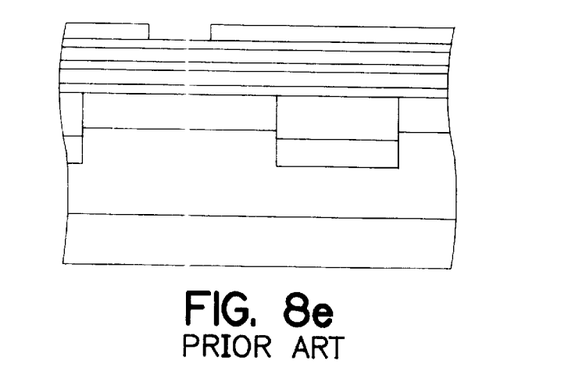
Figure 8F:
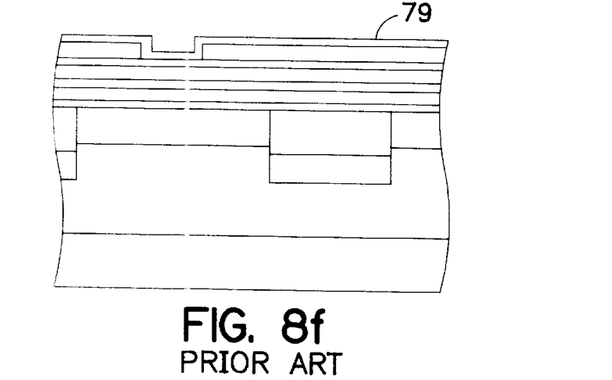

Thereafter, anisotropic etching is performed by reactive ion etching or the like using patterned resist 91 as shown in FIG. 8(d), and then resist 91 is removed as shown in FIG. 8(e), whereafter insulation film 79 is formed as shown in FIG. 8(f).

By the way, one of major characteristics of a solid state imaging apparatus is a smear characteristic. Smear signifies false signal charge which leaks into charge transfer elements 73 within a period within which signal charge is transferred in vertical CCD registers 32. Usually, in order to suppress the smear, a light intercepting film made of a metal film is formed such that it covers over vertical transfer electrodes 61 and 62 provided on charge transfer elements 73. It is to be noted that, in FIG. 4, shunt wirings 52 serve also as the light intercepting film.

In order to suppress the smear, it is preferable to intercept light in the entire area other than photoelectric transducers 31. However, where shunt wirings 52 serve also as the light intercepting film as shown in FIG. 4, gaps between the shunt wirings are produced on the delivery regions. Consequently, light incident through the gaps between shunt wirings 52 makes a cause of the smear. Since an i-line stepper is usually used on the product level, opening width d' of resist 91 in FIG. 7(c) is approximately 0.4 $\mu$m. Therefore, gap d1 between shunt wirings 52 in FIG. 4 is 0.4 $\mu$m or more. Since visible rays can pass the gaps of approximately 0.4 $\mu$m, there is a problem in that the smear cannot be suppressed sufficiently.

In order to improve this, a technique of newly adding a light intercepting film for covering over the gaps between shunt wirings 52 on the delivery regions has been proposed. A technique of the type just mentioned is disclosed, for example, in Japanese Patent Laid-Open Application No. Heisei 4-216672.

Figure 9:
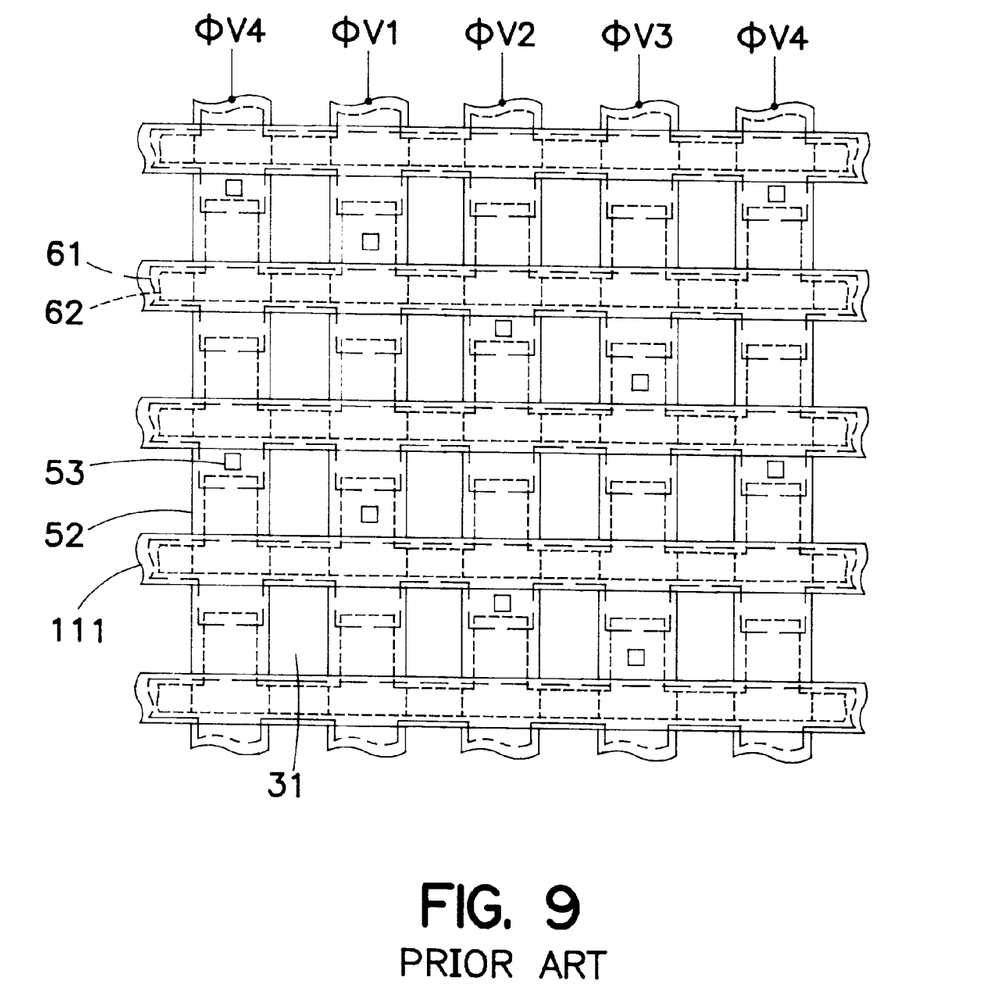
FIG. 9 is a schematic plan view of part of an imaging region of a further conventional solid state imaging apparatus which includes a light intercepting film on delivery regions.

FIG. 9 is a schematic plan view of part of an imaging region of a conventional solid state imaging apparatus which has a light intercepting film on delivery regions. In FIG. 9, reference numeral 111 denotes a light intercepting film, and the same components as those of FIG. 4 are denoted by the same reference numerals.

In FIG. 9, the imaging region is shown for approximately four pixels in both of the vertical and horizontal directions. Referring to FIG. 9, the solid state imaging apparatus shown is different in construction from that shown in FIG. 4 in that additional light intercepting film 111 made of an aluminum film or some other suitable film is provided such that it extends in the horizontal direction on delivery regions and that shunt wirings 52 have a striped shape having no projections. In the solid state imaging apparatus shown in FIG. 9, since light intercepting film 111 is formed, the smear caused by light leaking through the gaps between shunt wirings 52 on the delivery regions, which is a problem with the solid state imaging apparatus shown in FIG. 4, can be suppressed to some degree. However, the solid state imaging apparatus shown in FIG. 9 involves another factor which causes smear.

Figure 10:
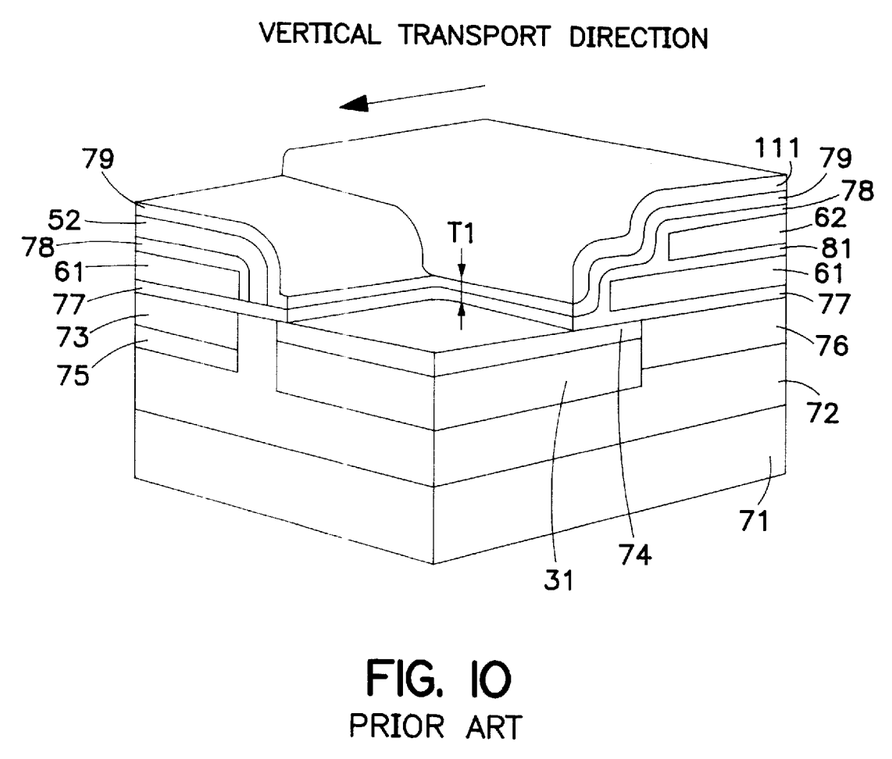
FIG. 10 is a schematic perspective view of a corner at which a shunt wiring and a light intercepting film shown in FIG. 9 intersects with each other.

FIG. 10 is a schematic perspective view of a corner at which a shunt wiring and a light intercepting film shown in FIG. 9 intersect with each other. Here, the same reference numerals are applied to the same components as those of FIGS. 5, 6 and 9.

As can be seen from FIG. 10, insulation film 79 formed above shunt wirings 52 is present below light intercepting film 111. Accordingly, thickness T1 of the insulation film between the interface between semiconductor substrate 71 and insulation film 77 and light intercepting film 111 is greater than (for example, is equal to approximately two times) the thickness (for example, approximately 0.2 μm) of the insulation film between the interface between semiconductor substrate 71 and insulation film 77 and shunt wirings 52. In particular, the present structure has a problem in that oblique light from the insulation film between the interface between semiconductor substrate 71 and insulation film 77 and light intercepting film 111 is liable to leak in to cause smear. The structure has another problem also in that, where formation of light intercepting film 111 cannot be used commonly for the step of producing peripheral wirings (not shown) for imaging region 37, the PR number increases.

SUMMARY OF THE INVENTION

It is an object of the present invention to provide a solid state imaging apparatus wherein metal wirings for supplying driving pulses to transfer electrodes of vertical CCD registers are provided along the vertical CCD registers and the smear characteristic is improved.

According to the present invention, a solid state imaging apparatus which includes a plurality of photoelectric transducers, vertical CCD registers for receiving and transferring charge of the photoelectric transducers via charge read-out regions, a horizontal CCD register for receiving and transferring charge from the vertical CCD registers, a charge detector for detecting charge from the horizontal CCD register, and an output amplifier for amplifying and outputting charge from the charge detector, and wherein metal wirings for supplying driving pulses to vertical transfer electrodes of the vertical CCD registers are disposed along the vertical CCD registers, and the metal wirings are formed in a projecting manner in regions between adjacent ones of the photoelectric transducers in the vertical direction and the distance between the projecting portions of the adjacent ones of the metal wirings is 0.2 μm or less.

The distance between the projecting portions of the adjacent ones of the metal wirings may be such that an electric field between adjacent ones of the metal wirings is $10^7$ V/cm or less.

In particular, since the distance between the projecting portions of adjacent ones of the metal wirings is 0.2 μm or less and is limited to a distance with which an electric field between adjacent ones of the metal wirings is $10^7$ V/cm or less and the adjacent metal wirings do not suffer from short-circuiting, leakage of visible rays from gaps between the metal wirings can be reduced approximately to zero. Consequently, the smear characteristic is improved without provision of an additional light intercepting film.

DETAILED DESCRIPTION OF THE PREFERRED EMBODIMENT

Figure 11:
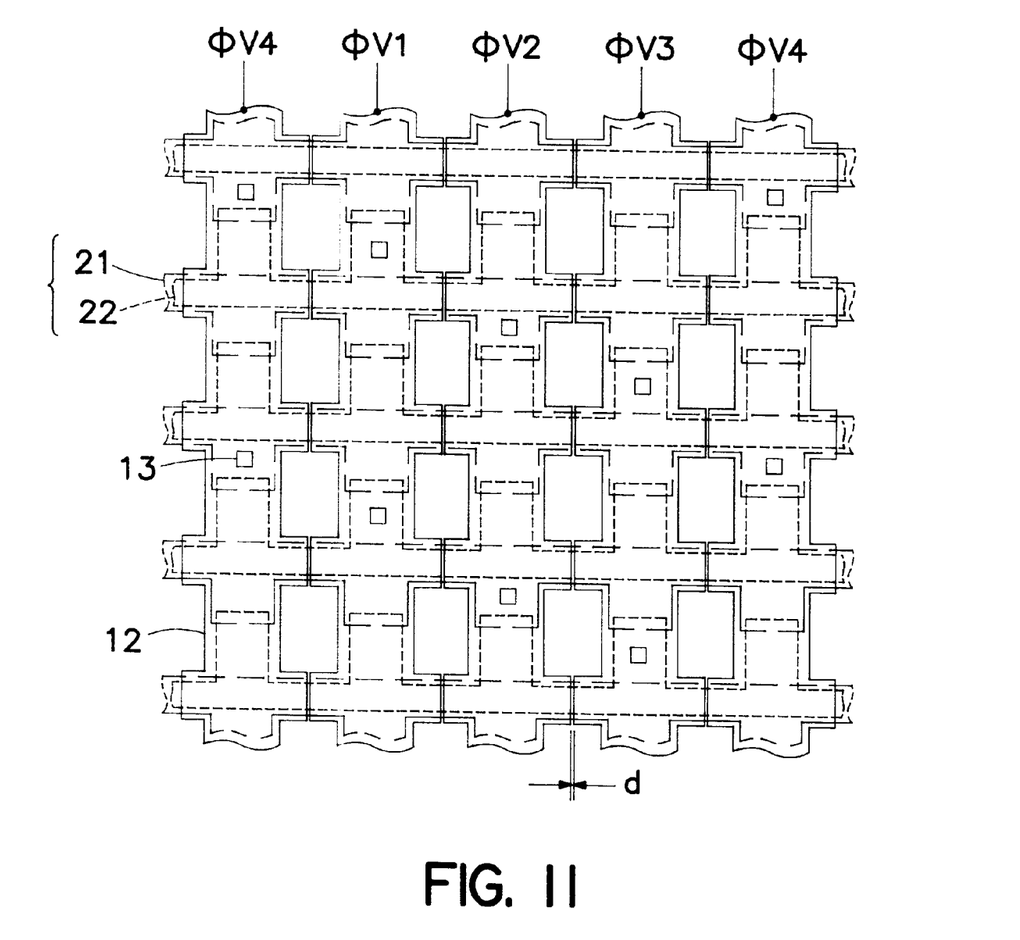
FIG. 11 is a schematic plan view of part of an imaging region of a solid state imaging apparatus of an embodiment of the present invention.

An embodiment of the present invention is described with reference to the drawings. FIG. 11 is a schematic plan view of part of an imaging region of a solid state imaging apparatus of an embodiment of the present invention. In FIG. 11, reference numeral 11 denotes a photoelectric transducer, 12 a shunt wiring, 13 a backing contact, and 21 and 22 denote each a vertical transfer electrode.

Here, the solid state imaging apparatus is shown for approximately four pixels in both of the vertical and horizontal directions. The construction shown in FIG. 11 is basically the same as that of the solid state imaging apparatus shown in FIG. 4. A plurality of vertical transfer electrodes 21 and 22 are provided for vertical CCD registers. Vertical transfer electrodes 21 and 22 extend in the horizontal direction and are formed in a comb-like shape such that openings may be provided on photoelectric transducers 11. Shunt wirings 12 extend in the vertical direction on the vertical CCD registers such that they cover over vertical transfer electrodes 21 and 22. Shunt wirings 12 are connected to vertical transfer electrodes 21 and 22 periodically at intervals of four electrodes in the vertical direction and at intervals of four pixels in the horizontal direction by backing contacts 13. It is to be noted that, since shunt wirings 12 function as wirings for supplying vertical driving pulses to vertical transfer electrodes 21 and 22, adjacent shunt wirings 12 in each delivery region are separated from each other. Here, the difference from FIG. 4 resides only in that gap d between adjacent shunt wirings 12 is 0.2 μm or less and thus smaller.

Figure 12:
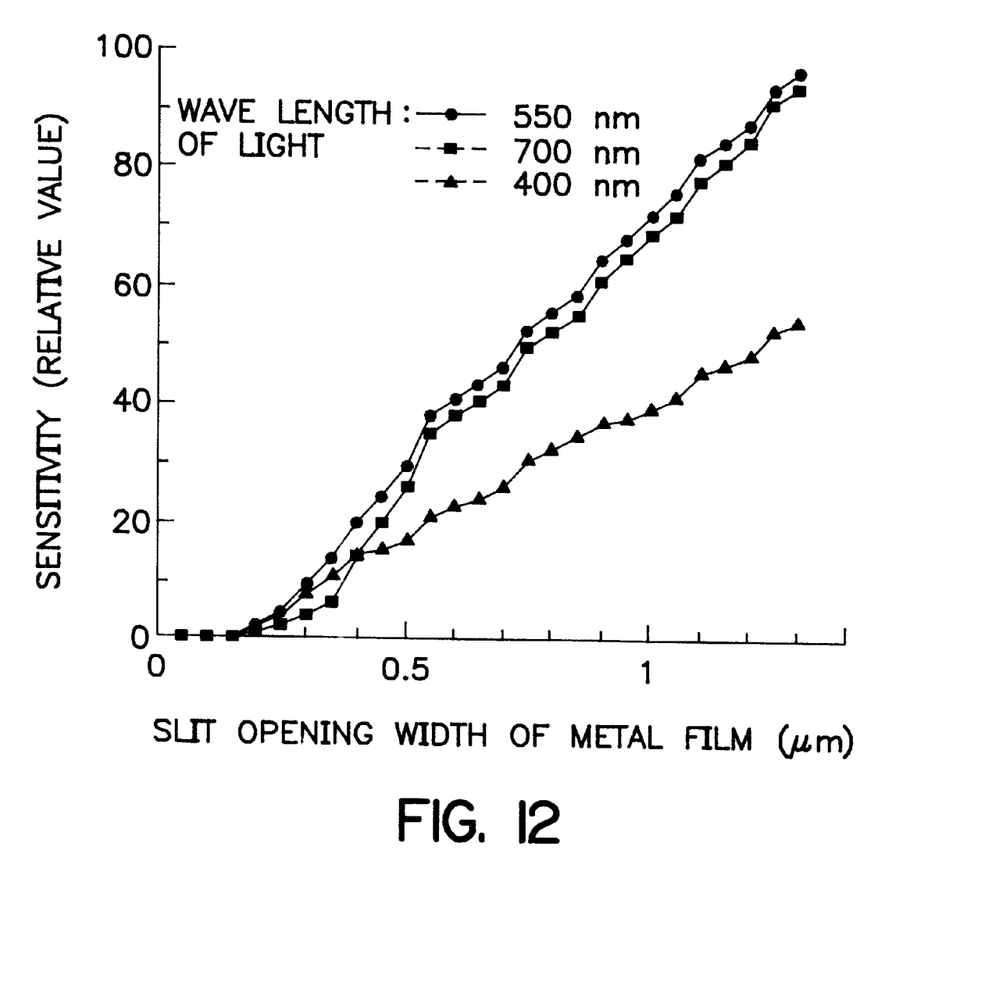
FIG. 12 is a graph showing a result of simulation of the sensitivity characteristic with respect to a slit opening width of a metal film.

FIG. 12 is a graph showing a result of simulation of the sensitivity characteristic with respect to the slit opening width of the metal film. The parameter is the wavelength of light, and three curves for different wavelengths of 400 nm, 550 nm and 700 nm are shown in FIG. 12. It is to be noted that, the model used in the present simulation is disclosed in a paper published by the inventors, "IEEE INTERNATIONAL ELECTRON DEVICES MEETING TECHNICAL DIGEST", December 1995, pp.159–162. Referring to FIG. 12, where the distance between shunt wirings 12 is 0.2 μm or less, the sensitivity is approximately 0 with all of the wavelengths. In short, if the distance between shunt wirings 12 is larger than 0.2 μm, then light passes the gap between them and makes a cause of smear, but where the distance between the shunt wirings is 0.2 μm or less (preferably 0.15 μm or less), little light can pass the gap and, in terms of the light intercepting characteristic, the gap can be considered to be substantially equivalent to absence of such gap. Accordingly, comparing with conventional solid state imaging apparatus wherein the gap is approximately 0.4 μm, the smear characteristic is improved significantly. Further, in the present invention, since shunt wirings 12 are formed at locations nearer from the interface between semiconductor substrate 71 and insulation film 77 than light intercepting film 111 shown in FIG. 9, also smear arising from oblique light can be suppressed.

It is to be noted that the gap between shunt wirings 12 must be provided so that an electric field applied between the adjacent shunt wirings be $10^7$ V/cm or less in order to prevent a strong electric field from being applied between the adjacent shunt wirings to cause dielectric breakdown, which causes short-circuiting.

A method of forming the gap between shunt wirings 12 so as to be 0.2 μm or less in this manner is described with reference to FIGS. 7(a) to 7(c) and 8(d) to 8(f). Similar steps to those described above are performed until which the condition of FIG. 7(b) is reached. Then, as shown in FIG. 7(c), resist 91 is applied to shunt wirings 52, and then, for example, using a direct electron beam drawing technique, the resist at locations on the delivery regions and at the openings (not shown) of photoelectric transducers 31 is removed. It is to be noted that at least the gaps between shunt wirings 52 on the delivery regions are exposed to light using a direct electron beam drawing method while the other portions are exposed to light by an i-line stepper. Since the exposure time can be reduced by simultaneously using the i-line stepper, the production time can be reduced. By using the direct electron beam drawing technique, resist opening width d' on the delivery regions can be formed with approximately 0.15 μm.

Thereafter, similar steps as those described hereinabove with reference to FIGS. 8(d) to 8(f) are performed. However, in etching of shunt wirings 52, the side etching amount must be suppressed to 0.05 μm or less totally on the opposite sides of each wiring. This can be achieved sufficiently by a conventional anisotropic etching technique.

By the production method described above, the gap between shunt wirings 12 can be formed with 0.2 μm or less.

It is to be noted that the construction of FIG. 11 can naturally be applied to both of a solid state imaging apparatus of the interline transfer type and a solid state imaging apparatus of the frame interline transfer type.

As described above, with the solid state imaging apparatus of the present invention, there is an advantage in that the smear characteristic is improved because leakage of visible rays from a gap between shunt wirings can be reduced almost to zero by limiting the distance between adjacent shunt wirings in a delivery region to a distance of 0.2 μm or less with which adjacent shunt wirings do not suffer from short-circuiting.

What is claimed is:

1. A solid state imaging apparatus which includes a plurality of photoelectric transducers, vertical CCD registers for receiving and transferring charge of said photoelectric transducers via charge read-out regions, a horizontal CCD register for receiving and transferring charge from said vertical CCD registers, a charge detector for detecting charge from said horizontal CCD register, and an output amplifier for amplifying and outputting charge from said charge detector, and wherein metal wirings for supplying driving pulses to vertical transfer electrodes of said vertical CCD registers disposed vertically along said vertical CCD registers, and said metal wirings are formed having projecting portions in regions between adjacent ones of said photoelectric transducers in the vertical direction and the distance between the projecting portions of the adjacent ones of said metal wirings is 0.2 μm or less so that leakage of visible light between said projecting portions is reduced substantially to zero.

2. A solid state imaging apparatus as claimed in claim 1, wherein the distance between the projecting portions of the adjacent ones of said metal wirings is such that an electric field between adjacent ones of said metal wirings is $10^7$ V/cm or less.

* * * * *